US007093688B2

(12) United States Patent
Lee

(10) Patent No.: US 7,093,688 B2
(45) Date of Patent: Aug. 22, 2006

(54) STRUCTURE FOR PREVENTING THE GENERATION OF STANDING WAVES AND A METHOD FOR IMPLEMENTING THE SAME

(75) Inventor: Dae-Eop Lee, Kyongsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 277 days.

(21) Appl. No.: 10/166,360

(22) Filed: Jun. 11, 2002

(65) Prior Publication Data

US 2003/0042068 A1 Mar. 6, 2003

Related U.S. Application Data

(60) Provisional application No. 60/316,970, filed on Sep. 5, 2001.

(51) Int. Cl.
*H05K 5/00* (2006.01)

(52) U.S. Cl. ...................... 181/155; 381/386; 381/347; 381/345

(58) Field of Classification Search ................ 381/336, 381/332, 335, 386, 387, 391, 345, 347, 349, 381/350, 352, 160; 181/148–156
See application file for complete search history.

(56) References Cited

U.S. PATENT DOCUMENTS 2,073,747 A * 3/1937 Koroncai et al. ........... 181/148
2,440,078 A * 4/1948 Devine ....................... 181/154
2,550,336 A * 4/1951 Daniel ........................ 181/154
3,909,530 A * 9/1975 Gosswiller .................. 381/342
3,964,571 A 6/1976 Snell
3,989,909 A * 11/1976 Hodsdon et al. ............ 381/391
4,071,111 A * 1/1978 Croup ........................ 181/149
4,109,983 A * 8/1978 Kinoshita .................. 312/7.1
4,166,933 A * 9/1979 Cinquino .................... 381/389
4,196,791 A * 4/1980 Gottlieb ...................... 181/155
4,424,881 A * 1/1984 Hattori ....................... 181/155
4,588,042 A * 5/1986 Palet et al. ................ 181/153
4,750,585 A 6/1988 Collings
4,869,340 A * 9/1989 Coudoux .................... 181/146
4,889,208 A 12/1989 Sugihara
4,891,842 A 1/1990 Green
4,917,212 A * 4/1990 Iwaya ........................ 181/141
4,928,788 A * 5/1990 Erickson ..................... 181/141

(Continued)

FOREIGN PATENT DOCUMENTS

DE 40 00 132 7/1991

(Continued)

OTHER PUBLICATIONS

"Communication" and "Search Report" issued by European Patent Office dated on Nov. 5, 2003.

(Continued)

*Primary Examiner*—Edgardo San Martin
*Assistant Examiner*—Erick Glass
(74) *Attorney, Agent, or Firm*—Robert E. Bushnell, Esq.

(57) ABSTRACT

A speaker assembly includes a speaker mounted within a housing having a front plate and a base plate. The speaker is inclined with respect to the front plate. The base plate includes one of an inclined type structure, a convex type structure, a radial rib type structure having radial ribs, and an uneven structure having projections. The front plate includes holes of certain shapes such as having two half holes formed on opposite sides of front plate and communicating with each other through a common opening formed between the two half holes.

46 Claims, 16 Drawing Sheets

U.S. PATENT DOCUMENTS

| | | | | | |
|---|---|---|---|---|---|
| 4,949,386 | A | * | 8/1990 | Hill | 381/349 |
| 5,111,905 | A | | 5/1992 | Rodgers | |
| 5,123,500 | A | * | 6/1992 | Malhoit et al. | 181/144 |
| 5,266,752 | A | * | 11/1993 | Cussans | 181/155 |
| 5,278,361 | A | | 1/1994 | Field | |
| 5,285,501 | A | * | 2/1994 | Castillo | 381/86 |
| 5,333,204 | A | * | 7/1994 | Hamada et al. | 381/346 |
| 5,471,018 | A | * | 11/1995 | Nieuwendijk et al. | 181/152 |
| 5,734,732 | A | * | 3/1998 | Lemmon | 381/386 |
| 5,749,433 | A | * | 5/1998 | Jackson | 181/156 |
| 5,754,669 | A | * | 5/1998 | Shiota et al. | 381/386 |
| 5,838,809 | A | | 11/1998 | Sato et al. | |
| 5,932,850 | A | | 8/1999 | Sabato et al. | |
| 5,995,634 | A | * | 11/1999 | Zwolski | 381/160 |
| 6,009,972 | A | * | 1/2000 | Choi et al. | 181/155 |
| 6,062,338 | A | | 5/2000 | Thompson | |
| 6,104,823 | A | | 8/2000 | Tanaka | |
| 6,134,332 | A | * | 10/2000 | Wiener | 381/160 |
| 6,144,746 | A | | 11/2000 | Azima et al. | |
| 6,237,715 | B1 | * | 5/2001 | Tracy | 181/156 |
| 6,320,971 | B1 | | 11/2001 | Tozawa | |
| 6,351,541 | B1 | * | 2/2002 | Zinserling | 381/322 |
| 6,434,240 | B1 | * | 8/2002 | Kulas | 381/89 |
| 6,614,722 | B1 | * | 9/2003 | Polany et al. | 367/131 |
| 6,636,610 | B1 | * | 10/2003 | Betts | 381/345 |
| 2005/0163334 | A1 | * | 7/2005 | Suprapmo et al. | 381/337 |

FOREIGN PATENT DOCUMENTS

| | | | | |
|---|---|---|---|---|
| DE | 40 11 132 | A | | 7/1991 |
| DE | 4000132 | A | | 7/1991 |
| EP | 0614314 | | | 9/1994 |
| GB | 2181620 | A | * | 4/1987 |
| GB | 2 301 727 | | | 12/1996 |
| GB | 2 301 727 | A | | 12/1996 |
| GB | 2 310 559 | | | 8/1997 |
| GB | 2 310 559 | A | | 8/1997 |
| JP | 2 152397 | | | 6/1990 |
| JP | 07131876 | | | 5/1995 |
| JP | 08023592 | | | 1/1996 |
| JP | 08149587 | | | 6/1996 |
| JP | 11155181 | | | 6/1999 |
| JP | 11 225388 | | | 8/1999 |
| JP | 2000-69581 | | | 3/2000 |
| JP | P2000-69581 | A | | 3/2000 |

OTHER PUBLICATIONS

*Communication* from the European Patent Office on the Jul. 15, 2005 in corresponding European patent application assigned serial No. EP 02 016 221.0—2202.

"Communication" issued by European Patent Office dated on Jan. 29, 2004.

* cited by examiner

STRUCTURE FOR PREVENTING THE GENERATION OF STANDING WAVES AND A METHOD FOR IMPLEMENTING THE SAME

CLAIM OF PRIORITY

This application makes reference to, incorporates the same herein, and claims all benefits accruing under 35 U.S.C. §119 from a provisional application entitled Structure for Preventing the Generation of Standing Waves and a Method for Implementing the Same earlier filed under 35 U.S.C. §111(b) in the United States Patent and Trademark Office on Sep. 5, 2001 and there duly assigned Ser. No. 60/316,970.

BACKGROUND OF THE INVENTION

1. Field of the Invention

The present invention relates to a speaker apparatus and implementing method of the speaker apparatus, and more particularly, to a speaker apparatus and implementing method of the speaker apparatus preventing the distortion of the original sound of the speaker, preventing the generation of standing waves within the speaker apparatus, and improving the articulation of the original sound.

2. Description of the Related Art

In conventional electronics having a speaker apparatus, a design concept has been a major factor to decide an outer appearance of the speaker apparatus. The actual structure and the size of a housing of the speaker apparatus is decided by a mold for the housing of the speaker apparatus. The speaker is arranged parallel to the housing and then secured to the housing. Therefore, the conventional speaker apparatus is disadvantageous due to distortion of the original sound generated from the speaker and due to the standing waves existing between the speaker and the housing of the speaker apparatus.

Exemplars of the art are U.S. Pat. No. 3,964,571 issued to Snell, for Acoustic System, U.S. Pat. No. 4,750,585 issued to Collings, for Loudspeaker Enclosure for Suppressing Unwanted Audio Waves, U.S. Pat. No. 4,889,208 issued to Sugihara, for Speaker Enclosures, U.S. Pat. No. 5,111,905 issued to Rodgers, for Speaker Enclosure, U.S. Pat. No. 5,278,361 issued to Field, for Loudspeaker System, U.S. Pat. No. 5,838,809 issued to Sato et al., for Speaker, U.S. Pat. No. 5,932,850 issued to Sabato et al., for Speaker System, U.S. Pat. No. 6,062,338 issued to Thompson, for Loud Speaker Enclosure, U.S. Pat. No. 6,104,823 issued to Tanaka, for Speaker System, U.S. Pat. No. 6,144,746 issued to Azima et al., for Loudspeakers Comprising Panel-form Acoustic Radiating Elements, and U.S. Pat. No. 6,320,971 issued to Tozawa, for Speaker System and a Method for Improving Sound Quality Thereof. I have found that the art does not disclose a speaker assembly that effectively reduces standing waves.

SUMMARY OF THE INVENTION

It is therefore an object of the present invention to provide an improved speaker assembly able to prevent the distortion of the original sound generated from a speaker of the speaker assembly.

It is another object to provide an improved speaker assembly able to prevent standing waves generated between a speaker and a housing of the speaker assembly.

It is still another object to provide a speaker assembly able to stabilize the output of the speaker.

It is yet another object to provide a speaker assembly able to prevent howling phenomenon generated within a housing of the speaker assembly.

It is still yet another object to provide a speaker assembly able to improve the articulation of the original sound generated from the speaker of the speaker assembly.

It is also an object to provide a speaker assembly able to improve the sensitivity of the speaker in a high frequency band area.

These and other objects may be achieved by providing a speaker assembly including a housing having a front plate and a base plate facing the front plate, a speaker coupled to the front plate, holes formed in the front plate for providing a passage of the sound generated from the speaker, each hole defined by a shape of an outer surface of a frustum of a cone or by two different or same shaped cylindrical surfaces disposed through the thickness of the front plate in series. The speaker is arranged to have an angle with respect to the front plate. The speaker can also form an angle with the base plate. The base plate can be a predetermined distance away from the speaker. The base plate is formed with one of a convex structure, an inclined surface structure with respect to a surface of the speaker, and a flat structure having a plurality of projections, ribs, or recesses facing the speaker.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
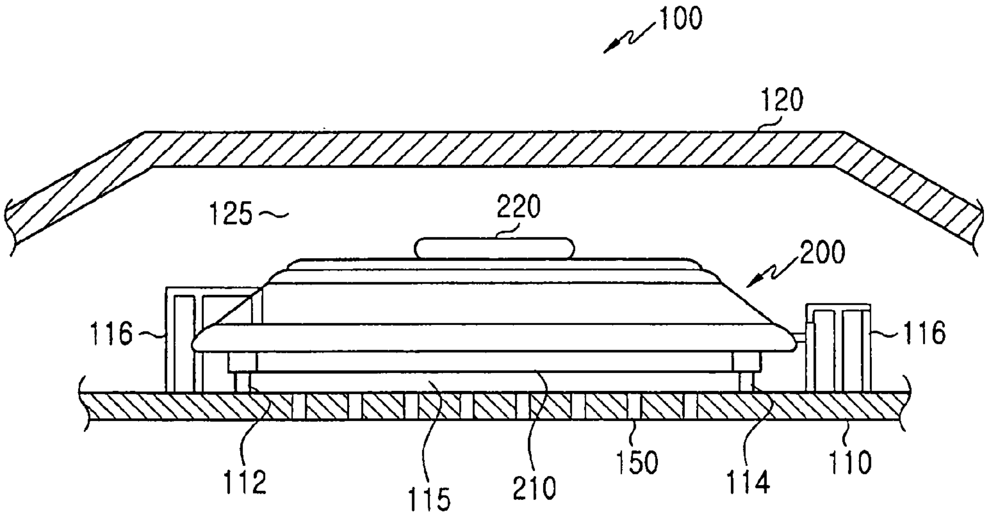
FIG. 1 is a partial cross-sectional view of a speaker assembly mounted in a wireless phone.
Figure 2A:
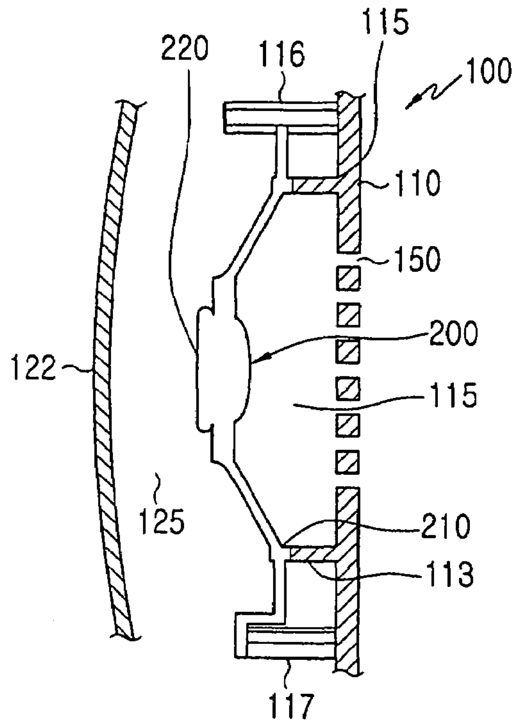
FIG. 2A is a partial cross-sectional view of another speaker assembly lengthwise.
Figure 2B:
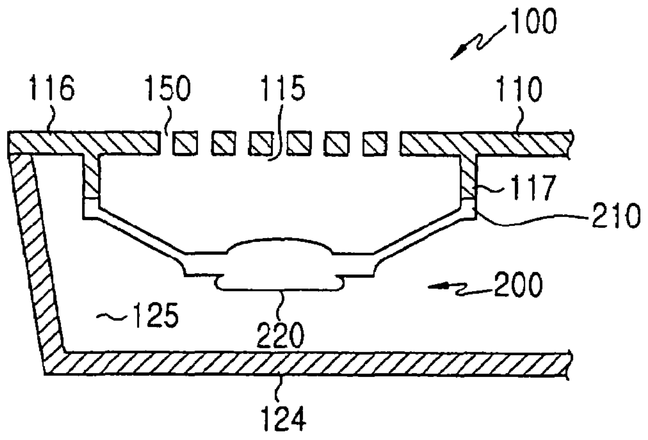
FIG. 2B is a partial cross-sectional view of another speaker assembly.

Turning now to the drawings, referring to FIG. 1, an earlier speaker assembly 100 includes a housing having a front plate 110 and a base plate 120 spaced-apart from the front plate 110. A speaker 200 having a cone structure is mounted on the front plate 110 by support 112, 114 and by coupling element 116. A front side 210 formed on an outer surface of the cone structure of speaker 200 faces front plate 110 while a rear side 220 of speaker 200 faces base plate 120. A plurality of holes 150 are formed on the front plate 110 of the housing. A front inner space 115 is formed between front plate 110 and front side 210 or the cone structure of speaker 200, and a rear inner space is formed between the base plate 120 and rear side 220 of speaker 200. The speaker 200 is assembled into the front plate 110 regardless of the shape of the front plate 110. Referring to FIG. 2A, a base plate 122 can have a concave design disposed on a rear side of a speaker 220. Referring to FIG. 2B, a speaker 220 can be mounted on the front plate of a round type housing with base plate 124 and parallel to the front plate 110.

Figure 3:
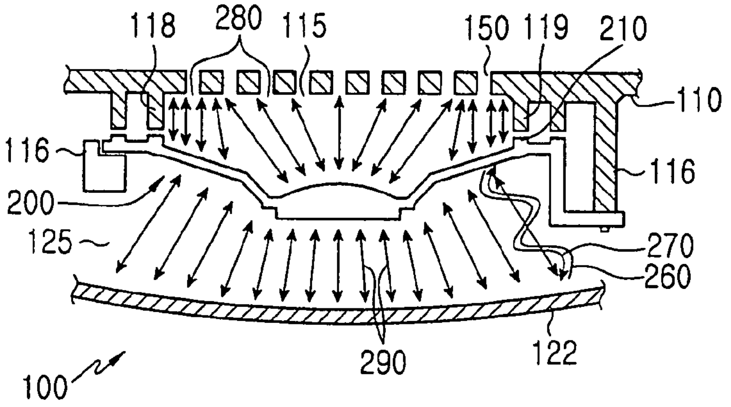
FIG. 3 shows a detail structure and standing waves of the speaker assembly.

Referring to FIG. 3, the assembly has a front plate 110 mounted with a speaker 200 and a base plate having a concave 122 or alternatively a flat structure. In FIG. 3, reference numerals 280, 290 denote incident and reflected waves of standing waves, and numerals 260 and 270 denote standing waves generated between speaker 200 and base plate 120 or front plate 110. Standing waves 260 and 270 (overlapped) are generated by the speaker assembly that has the speaker 200 parallel with front plate 110 and base plate 120 and the housing and base is flat or concave in shape. The output of speaker 200 is lowered, and the original sound generated from speaker 200 is distorted and deteriorated because of the standing waves.

A standing wave is more clearly described by the following. Sound is a propagating wave of which a wavelength s is equal to a speed v divided by an oscillation frequency $f$. For example, the wavelength of the sound having a frequency of 20 hertz is 17 m which is 340 divided by 20. The wave propagating toward a wall is reflected by the wall. If there are two spaced-apart parallel walls, the sound wave moves back and forth between the two walls. If a distance between the two walls is a multiple of a natural number and a half wavelength of the sound wave, the sound wave exhibits a specific phenomenon. The incident wave and the reflected wave are completely overlapped to show the vibration of air looking as if there is no movement. This kind of wave is called the standing wave because this wave does not propagate.

If the front plate 110 of the housing is spaced-apart too much from speaker 200, speaker 200 unnecessarily needs more output power than if speaker 200 is disposed closer to front plate 110 because frequency characteristics of a high frequency band of the audio sound are cutout or deteriorated.

Figure 4A:
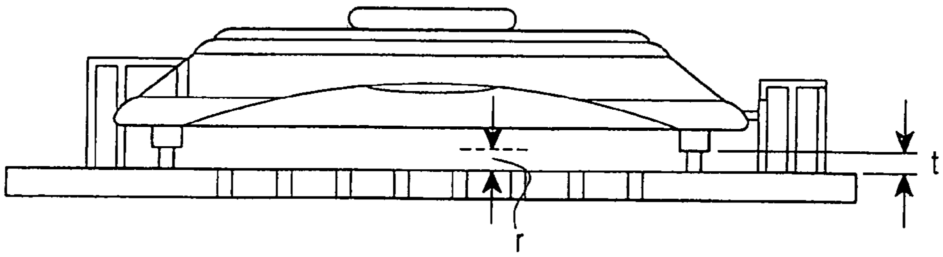
FIGS. 4A, 4B, and 4C show a relationship between sensitivity and frequency in response to a length between a speaker and a front housing of the speaker assembly.
Figure 4B:
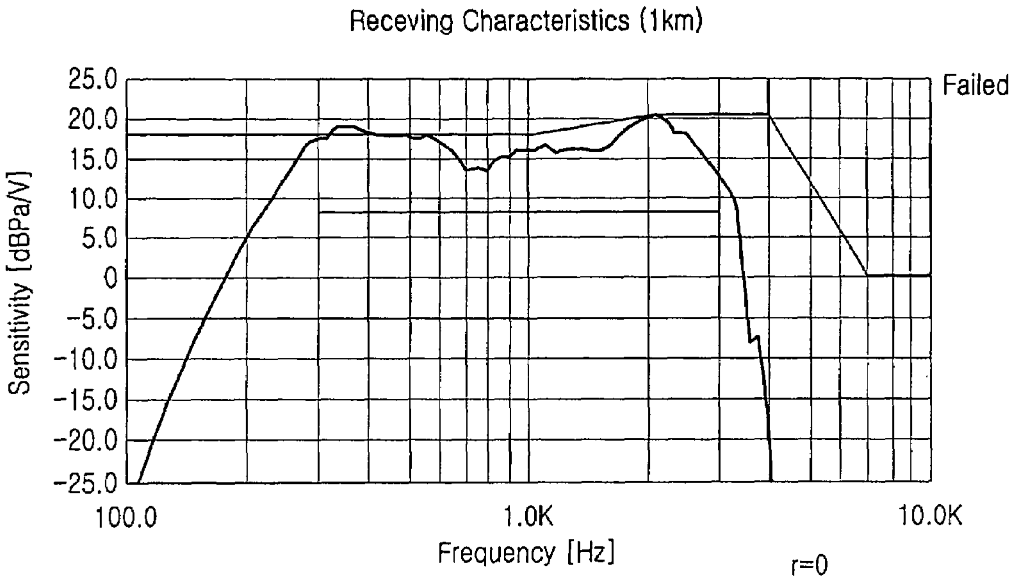
Figure 4C:
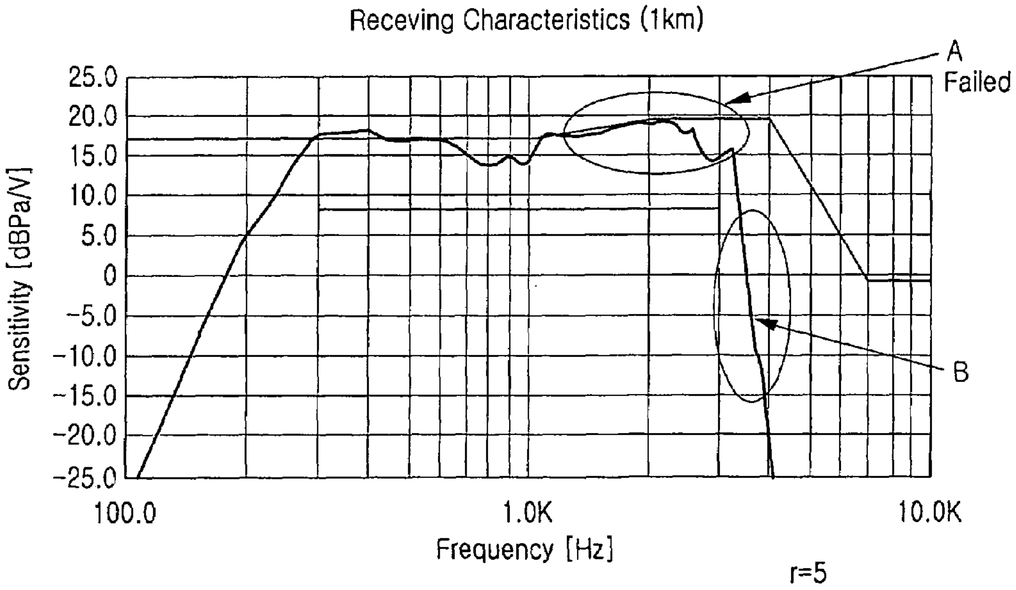

FIGS. 4A through 4C show test results of frequency characteristics in response to a distance “r” between front side 210 of speaker 200 and front plate 110 of the housing. The size of holes 150 formed on front plate 110 of the housing is 1.8 mm (millimeters) while the number of holes 150 is 47. FIG. 4B shows frequency characteristics when the distance r is zero. FIG. 4C shows frequency characteristics when the distance r is 5 mm. Reference letter A denotes the increased output power, and reference letter B denotes a high frequency characteristic cutoff.

If there is a space between speaker 200 and the housing, the original audio sound is changed. The distance r should be as short as possible, and ESD (electrostatic discharge) should be considered. Since the special effect caused by both the space and the distance is related to the size of holes formed on the front plate 110 of the housing, the volume of front space 115 can be decreased to maintain the original characteristics of the audio sound when the size of the holes increases. When the height “t” of support 112, 114, 115, 116, 117 is 1.5 mm (millimeters), the distance r is about 2.5 mm. A total distance between a bottom of the cone structure of speaker 200 and front plate 110 is about 8 mm.

In order to improve the quality of the audio sound of speaker assembly having a speaker 200 in a phone terminal with a concave and closed space for the speaker 200, the assembly needs first, a structure for preventing the standing waves existing in the speaker assembly and second, a closed structure for preventing a resonant and sonant sound caused by speaker 200.

Therefore, the shape of holes formed on a grill of front plate 110 for providing passages for the audio sound without distortion, the shape of front plate 110, and the shape of base plate 120 for both improving the quality of the original sound and preventing the standing waves and harmonics, such as an overtone, of speaker 200 are contemplated.

Figure 6A:
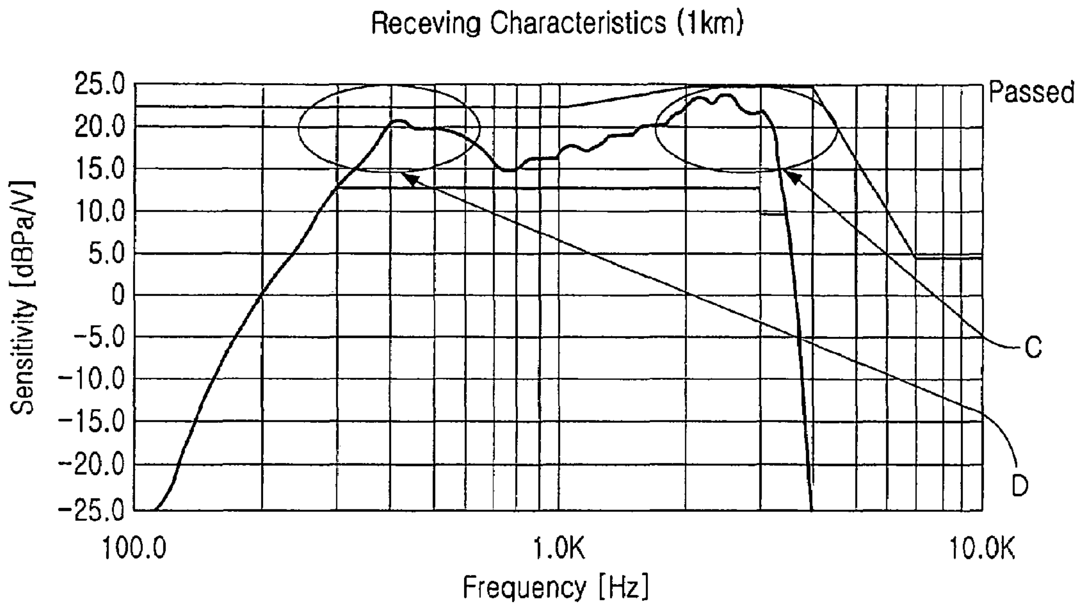
FIGS. 6A and 6B show a relationship between sensitivity and frequency in response to the distance between the speaker and the front housing and the numbers of holes formed on the front housing facing the speaker in the speaker assembly.
Figure 6B:
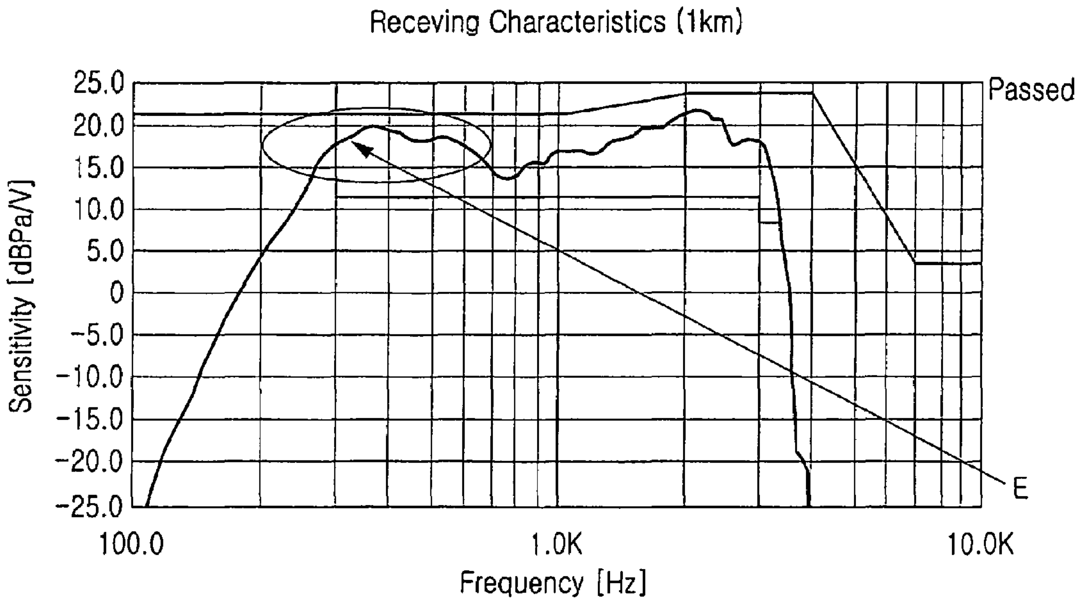

The following discusses the shape of the grill of the top housing that is the best for providing passages of the audio sound without distortion. The frequency characteristic responses of test results are shown in FIGS. 6A and 6B.

Figure 5A:
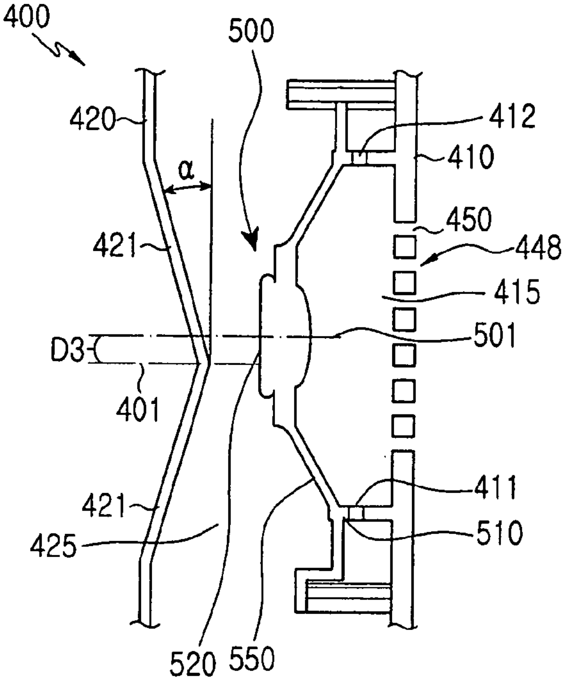
FIG. 5A is a partial cross-sectional view of a speaker assembly constructed according to the principles of the present invention.
Figure 5B:
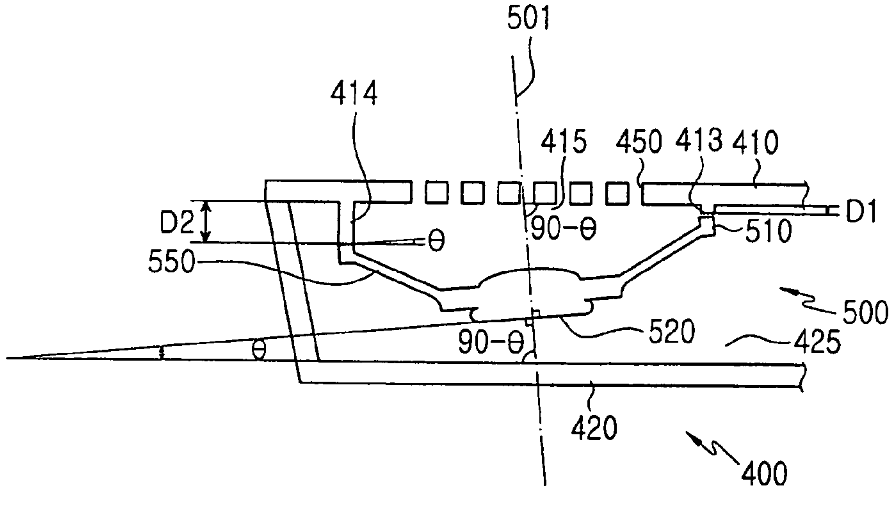
FIG. 5B is a cross-sectional view of another speaker assembly.

FIGS. 5A and 5B show a speaker assembling structure constructed according to the principles of the present invention. A speaker assembly 400 includes for example an electroacoustic transducer such as a loudspeaker 500 and a housing including a front plate 410 and a base plate 420 spaced apart from front plate 410. The speaker 500 includes a cone structure (conical diaphram) 550, a circular front side 510 of the cone structure, and a flat rear side 520. The flat rear side 520 may include a magnet of the speaker 500. The speaker 500 can also be other types of electroacoustic transducers having different configurations. The speaker 500 is coupled to the front plate 410. The speaker 500 could also possibly be coupled to the base plate 420 of the housing. A grill 448 having a plurality of holes 450 is formed on the front plate 410 of the housing. Supports 411, 412 are formed on a rear surface of front plate 410 and are disposed between front side 510 of speaker 500 and front plate 410. An inclined portion 421 is formed on the base plate 420. An axis 401 of inclined portion 421 of base plate 420 may be identical to or deviated from an axis 501 of speaker 500 by a distance D3. Inclined portion 421 has an angle $\alpha_2$ with a plane parallel with the front plate 410 and is raised from the base plate 420 toward rear side 520 of speaker 500.

Referring to FIG. 5B, each of a first support 413 and a second support 414 is projected from front plate 410 toward the speaker 500. First support 413 is different from second support 414 in height. The height D2 of the second support 414 is greater than the height D1 of first support 413. When speaker 500 is coupled to front plate 410, front side 510 of speaker 500 is not parallel to front plate 410 but inclined with respect to front plate 410 by an angle θ due to the difference between first and second supports 413, 414 in height. The axis 501 of speaker 500 is not perpendicular to front plate 410 but inclined with respect to a line perpendicular to front plate 410 by the angle θ. Other types of structures may also be used to provide the angle θ between the speaker 500 and the front plate 410.

In order to determine the shape of holes 450 formed on the grill of the front plate 410 for providing passages for the audio sound without distortion, various samples are tested such as 105 holes with 1.2 mm in diameter, 47 holes at 1.8 mm in diameter, and 38 holes with 2.0 mm in diameter. A speaker test is made according to a set distance from the housing to the cone of the speaker. The frequency characteristic responses are shown in FIGS. 6A and 6B representing the audio sound quality for each hole shape. The characteristic response graphs of FIGS. 6A and 6B are directed at tests for identifying a relationship between a surface area of a through hole in a front plate of the speaker and a size of the hole. In both FIGS. 6A and 6B, the distance from the housing to the cone of the speaker, a distance r shown in FIG. 4A, is set at 2.5 mm. FIG. 6A shows a test result for front plate 410 having 105 holes with 1.2 mm (millimeters) in diameter. A high frequency band portion indicated as C decreases, and also a low frequency band portion indicated as D decreases. FIG. 6B shows another test result of front plate 410 having 38 holes and 2.0 mm in diameter. A low frequency band portion indicated as E increases. Therefore, if the hole is a long hole, a half parting is adapted to the hole to have a parting area of 0.8 mm although a side parting shows the audio sound deteriorating due to the diffraction of the audio sound. If the hole is a circular hole, the hole formed through the thickness of the front plate of the housing is defined by an outer side circumferential surface of a frustum. A large opening area of the hole faces one of the speaker and an outside of the front plate of the housing. The standing waves are prevented because of a large effective surface area of the hole, and the characteristics of the low audio sound are improved because of the principles of a megaphone. The graphs of FIGS. 6A and 6B are also showing that even when the surface areas of the through holes are similar, the characteristics are changed according to the size of the hole.

Figure 7A:
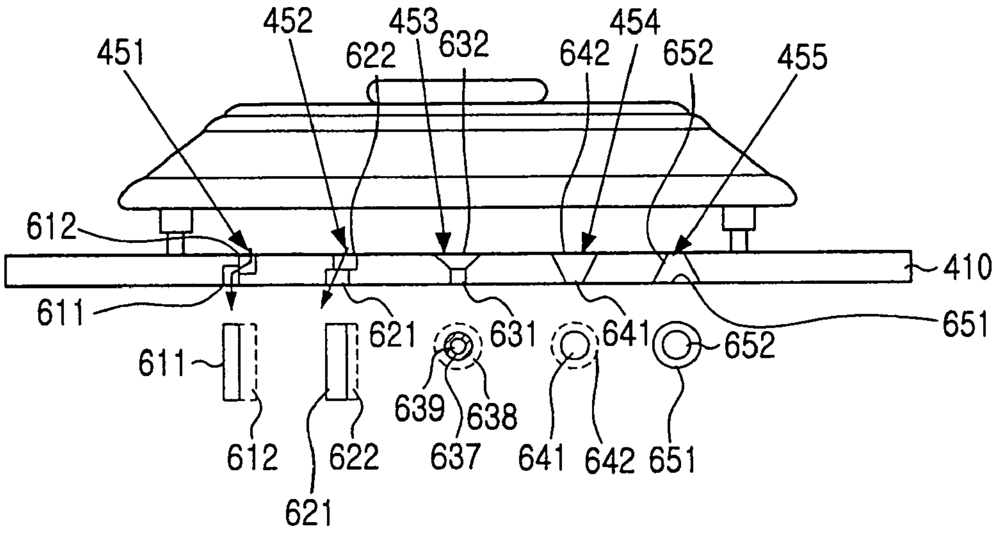
FIG. 7 shows various types of holes formed on the front housing of the speaker assembly.
Figure 7B:
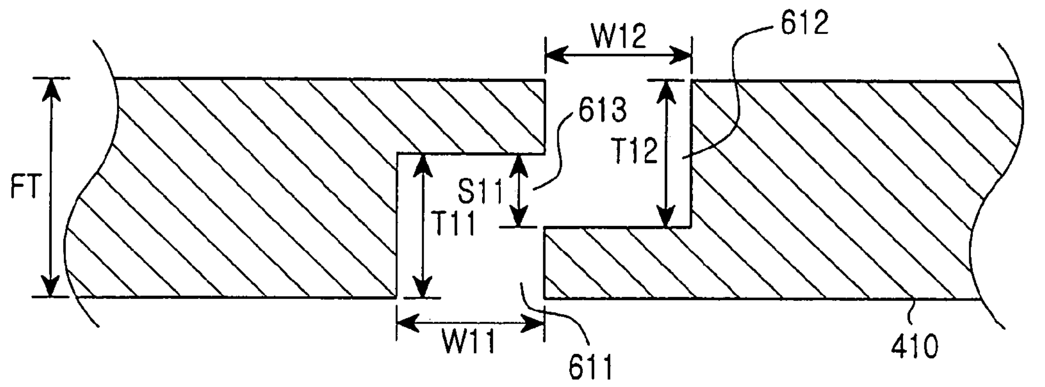
Figure 7C:
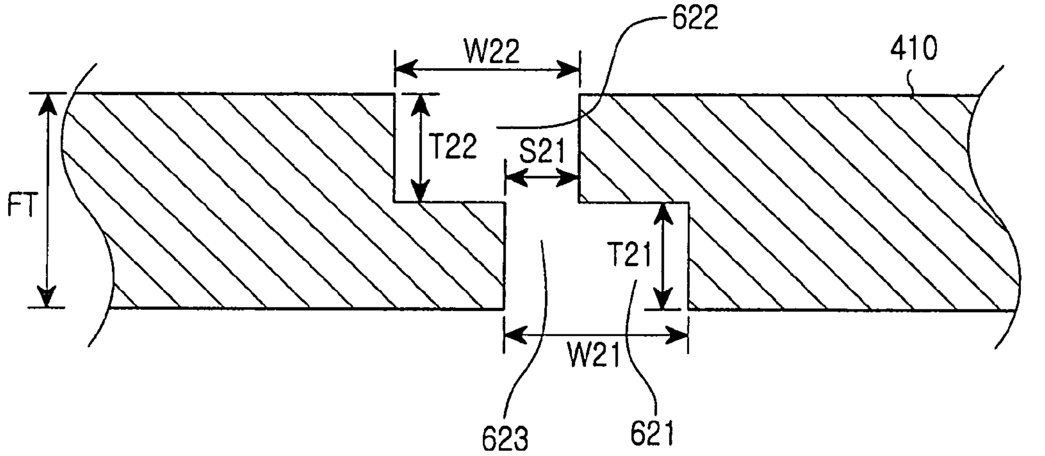

FIGS. 7A through 7G show various types of holes 450. A first hole 451 includes a first rectangular hole 611 and a second rectangular hole 612 communicating with first rectangular hole 611 through a common side opening 613 formed on a common side portion of first and second rectangular holes 611, 612 as shown in FIGS. 7A and 7B. The sum of depth T11 of first rectangular hole 611 and depth T12 of second rectangular hole 612 is greater than the thickness FT of front plate 410. W11 denotes a width of first rectangular hole 611 while W12 denotes a width of second rectangular hole 612. A width S11 of common side opening 613 is less than the thickness FT of front plate 410.

A second hole 452 includes a third rectangular hole 621 and a fourth rectangular hole 622 communicating with a third rectangular hole 621 through a common base opening 623 formed on a common base portion of third and fourth rectangular holes 621, 622. A width S21 of common base opening 623 is less than any one of a width W21 of first rectangular hole 621 and a width W22 of second rectangular hole 622. The thickness FT of front plate 410 is the sum of a thickness T22 of third rectangular hole 621 and a thickness T22 of fourth rectangular hole 622.

Figure 7D:
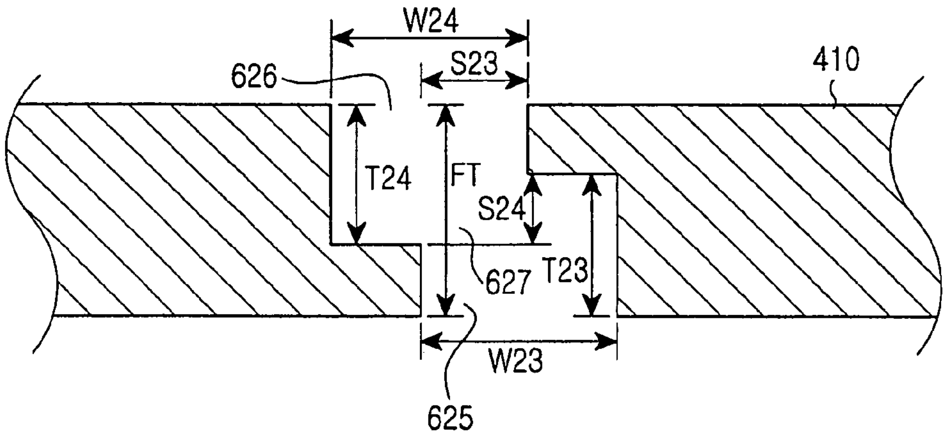

FIG. 7D shows another embodiment of second hole 452 including a fifth rectangular hole 625 and a sixth rectangular hole 626 communicating with fifth rectangular hole 625 through a common opening 627 formed on a common portion of fifth and sixth rectangular holes 625, 626. The common portion is formed on both the side portion and the base portion of fifth and sixth rectangular holes 626, 627. The thickness FT of front plate 410 is greater than each thickness T23, T24 but not greater than the sum of the thickness T23 of fifth rectangular hole 625 and the thickness T24 of the sixth rectangular hole 626.

Figure 7E:
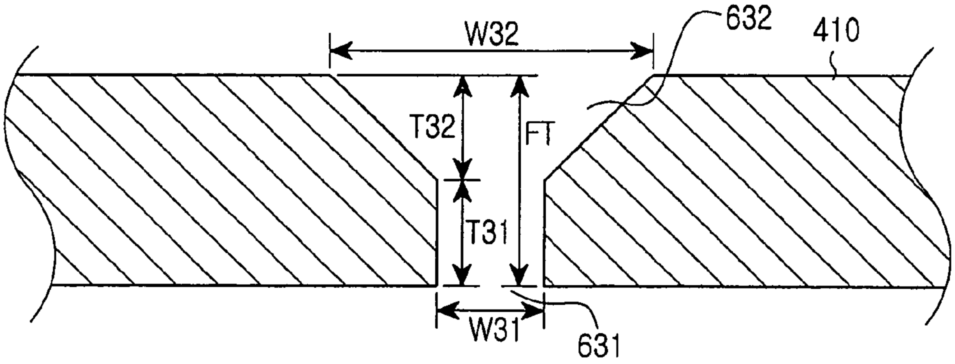

FIG. 7E shows a third hole including a cylindrical type hole 631 and a cone type hole 632 communicating with cylindrical type hole 631 through a common base opening 633. Cylindrical type hole 631 is defined by a circumferential side surface of a circular cylinder while cone type hole 632 is defined by a circumferential side surface of a frustum of a cone. A width W31 of cylindrical type hole 631 is less than a width W32 of cone type hole 632. The sum of each thickness T31, T32 of cylindrical type hole 631 and cone type hole 632 is the same as the thickness FT of front plate 410.

Figure 7F:
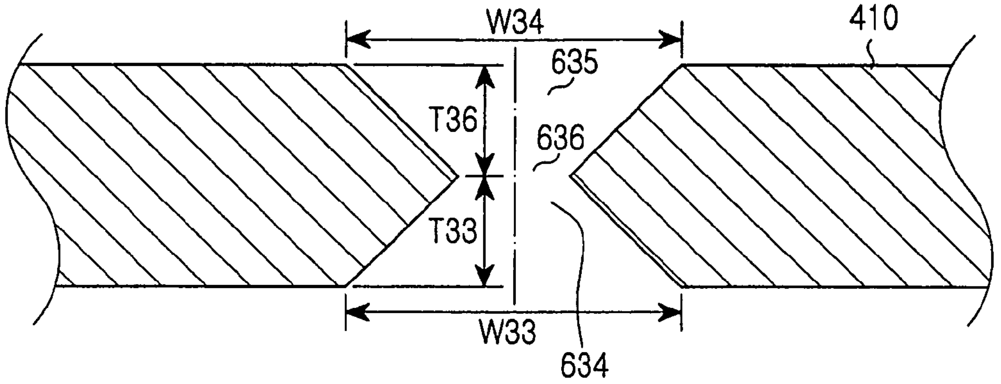
Figure 7G:
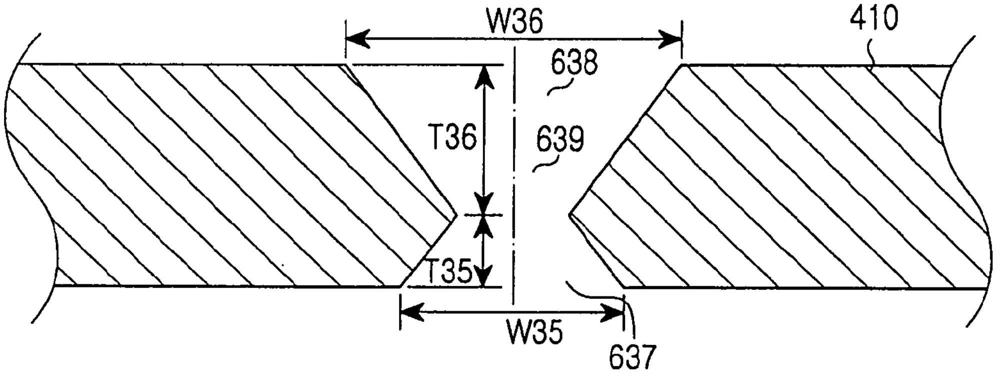

In FIG. 7F, two cone type holes 634, 635 communicate with each other through a common opening 636. A width W33 of one cone type hole 634 is the same as width W34 of the other cone type hole 635. A thickness T33 of one cone type hole 634 is the same as the thickness T34 of the other cone type hole 635. FIG. 7G shows two different cone type holes 637, 638 communicating with each other through a common opening 639. A diameter W35 of the one cone type hole 637 is less than the diameter W36 of the other cone type hole 638. A thickness T35 of the one cone type hole 637 is less than the thickness T36 of the other cone type hole 638. As shown in FIG. 7A, a fourth hole 454 and a fifth hole 455 are defined by an outer circumferential surface of a frustum of a cone. The fourth hole 454 includes a narrow opening 641 and a wide opening 642 facing speaker 500 while the fifth hole 455 includes a wide opening 651 and a narrow opening 652 facing the speaker 500.

If hole 450 formed on the grill of front plate 410 has longitudinal outer openings formed along a surface of front plate 410 in a longitudinal direction, such as first and second holes 451, 452, common opening 613, 623, 627 formed between two half holes 611 and 612, 621 and 622, 625 and 626, respectively, has a parting area of 0.8 mm.

If hole 450 is a circular hole, such as third, fourth, fifth holes 453, 454, 455, each of two respective half holes 631 and 632, 634 and 635, 637 and 638 formed through the thickness of front plate 410 is defined by either one of an outer side circumferential surface of a frustum and an outer circumferential surface of a cylinder. The standing waves are prevented because of a large effective surface area of holes 450, and the frequency characteristic responses of the speaker assembly for the low frequency band is improved.

Figure 8:
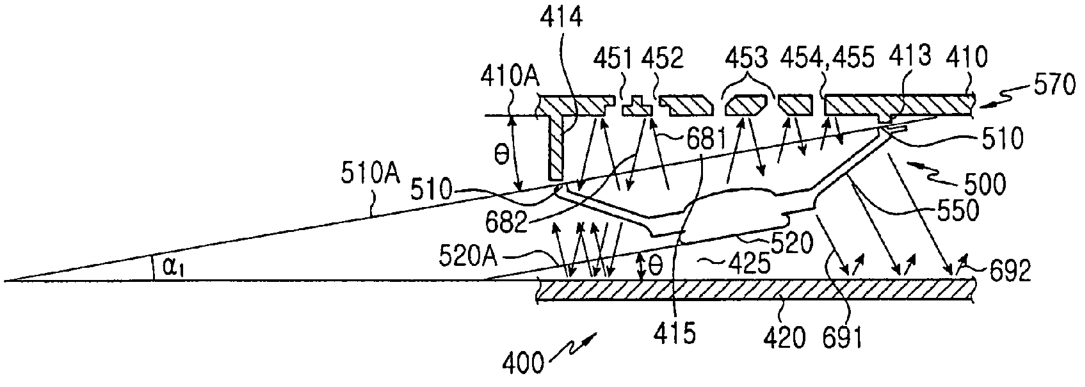
FIG. 8 shows an angle between the front housing and a front surface of the speaker and the non-existence of standing waves in the speaker assembly.

Referring to FIG. 8, the speaker 500 forms an angle θ with the housing. Speaker 500 assembled into front plate 410. Speaker 500 is mounted on distal ends of first support 413 and second support 414 formed on front plate 410. One of the holes 451, 452, 453, 454, 455 is formed in the front plate 410. A first speaker plane 510A is parallel with the speaker 510 and the plane 510A for instance passes either the distal ends of first and second supports 413, 414 or front side 510 of speaker 500. First speaker plane 510A has an angle θ with the front plate 410. The front plate 410 is parallel with the housing 570. The angle θ is in the range of 2.6 degrees in order to prevent the standing waves generated by overlapping the incident wave and the reflected wave from base plate 420 and front plate 410. The angle θ can be varied in other types of products. The angle θ between the speaker 500 and the housing can be varied from the range of 2.6 degrees according to the structure of the product based on certain grounds. The problem related to the standing frequency occurs from the fact that generated sound (wavelength) spreads, returns after being dashed against an object and the returned wavelength overlaps with the original wavelength. The articulation of the sound and the degree of standing wave could be changed according to factors such as the inner size that is fixing the speaker, shape and sound level according to the product structure. Along with the factor of the product structure there is also included inner shapes that are formed according to the structure, the size of the inner room, speaker's capacity and sound level being factors besides the structure. The first speaker plane 510A also forms an angle $\alpha_1$ with the base plate 420. When the base plate 420 is parallel with the front plate 410, then $\alpha_1$ is equal to θ. When the first speaker plane 510A is parallel with the rear side 520 of the speaker 500, then the angle between the rear side 520 and the base plate 420 is equal to θ. The rear side 520 may for example include a magnetic element of the speaker 500. Speakers of other shapes and components are also possible.

Waves 681 generated from speaker 500 are incident to the front plate 410 within front inner space 415, and then waves 682 are reflected from front plate 410. However, incident waves 681 are not overlapped with reflected waves 682 because speaker 500 is inclined with respect to front plate 410 and the housing 570. Waves 691 generated from speaker 500 are incident to base plate 420 within rear inner space 425, and then waves 692 are reflected from base plate 420. However, incident waves 691 are not overlapped with reflected waves 692 because speaker 500 is inclined with respect to base plate 410. Thus, the standing waves are prevented.

In order to avoid the overlapping between the vibration of the audio sound reflected from base plate 420 and the vibration of the audio sound generated from speaker 500, speaker 500 may be twisted or inclined with respected to front plate 410. The vibration of the reflected audio sound is prevented to be overlapped with the audio sound generated from speaker 500. Also, this speaker assembly 400 improves the distortion and the resonant and sonant sound of the rear audio sound as shown in FIG. 8 which depicts the speaker assembly in a lengthwise direction of a hand-phone set.

The structure of base plate 420 disposed behind speaker 500 reflects the rear sound generated by the rear surface of speaker 500 toward speaker 500. Base plate 420 shows a second diffuse-reflection of the rear sound by forming base plate 420 into a shape as shown in FIG. 8 in addition to a first diffuse-reflection of the rear sound by speaker 500 twisted or inclined with respect to front plate 410.

Figure 9:
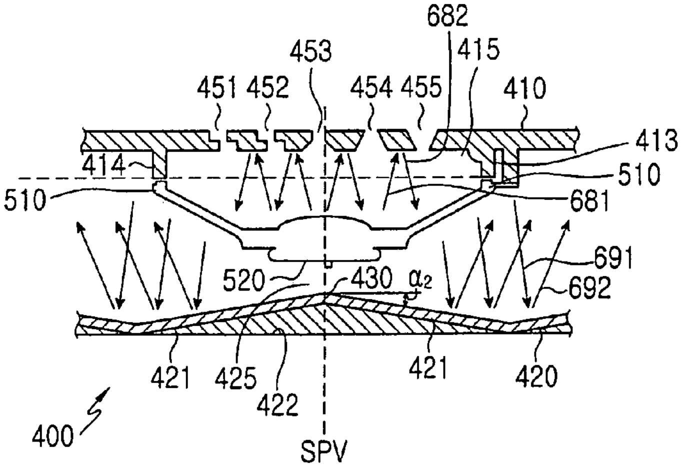
FIG. 9 shows the shape of the base plate and the prevention of standing waves in the speaker assembly.

Concerning the shape of the base plate of the speaker assembly, in FIG. 9, speaker assembly 400 includes an inclined plate 421 raised from a base plane 422 of base plate 420. Inclined plate 421 forms an angle $\alpha_2$ with front plate 410 and base plane 422 of base plate 420. The speaker 500 is parallel to the housing. Incident waves 681 within front inner space 415 are not overlapped with reflected waves 682, and also incident waves 691 within rear inner space 425 are not overlapped with reflected waves 692 because speaker 500 is inclined with respect to base plate 410, and because holes 450 including one of holes 451, 452, 453, 454, 455 are formed in a large effective surface area of front plate 410. The center line SPV of the speaker 500 (perpendicular with the rear side of the speaker 520 and the plane of the front side of the speaker 510A) coincides with the apex 430 of the base plate 420. The base plate has a diffuse reflection structure. The standing waves are prevented through the diffuse reflection structure 421 of the base plate 420. The base plate 420 may form the V-shape structure as shown by FIG. 9.

Figure 10:
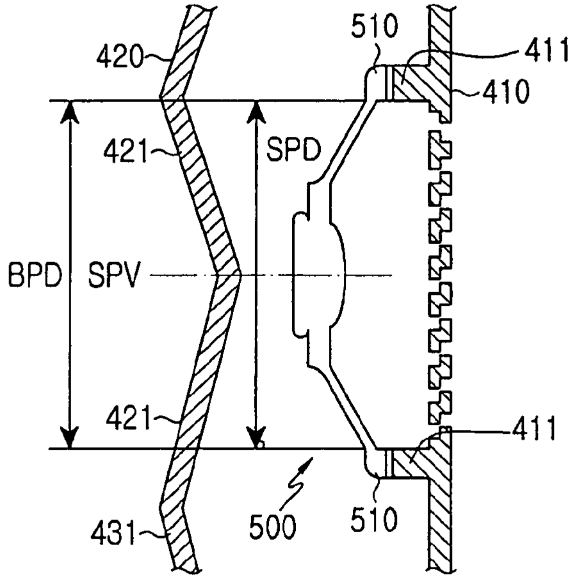
FIG. 10 is a partially exploded view of the speaker assembly showing the base plate.
Figure 11:
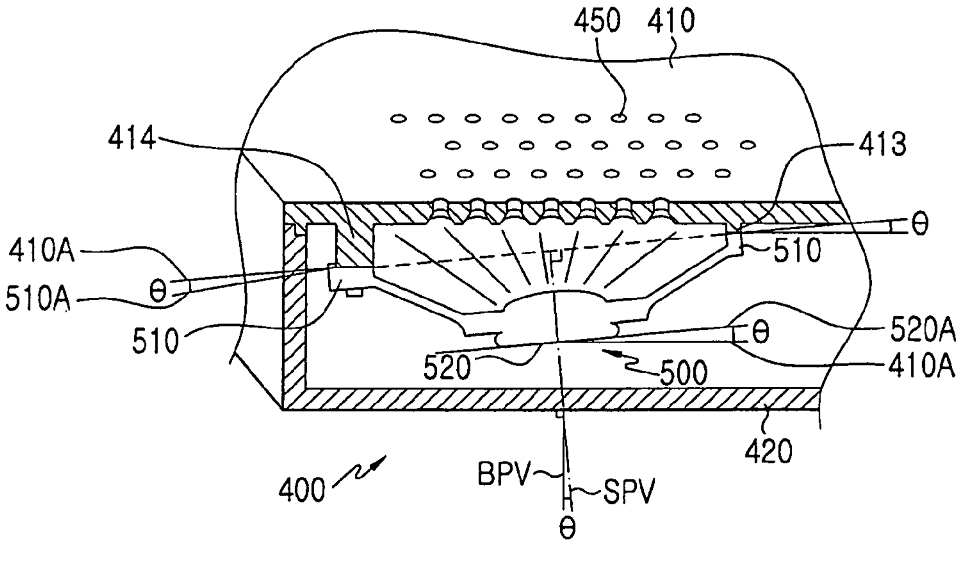
FIG. 11 is a partially exploded view of the speaker assembly.

FIG. 10 shows both front side 510 of speaker 500 having a diameter SPD and inclined plate 421 of base plate 420 having a width BPD which is equal to or greater than diameter SPD of front side 510 of speaker 500. A side plate 431 formed around inclined plate 421 is also inclined with respect to rear side 520 of speaker 500. In FIG. 11, a vertical line BPV perpendicular to front plate 410 or base plate 420 has the angle θ with a central vertical speaker line SPV perpendicular to the plane 510A of front side 510 of speaker 500. Either one of the plane 520A of rear side 520 and the plane 510A of front side 510 of speaker 500 forms the angle θ with a main plane 410A of front plate 510 or base plate 520.

With the above features of speaker assembly 400 including the shape of the grill discharging the audio sound, the assembling angle of speaker 500 on front plate 410, the diffuse-reflection structure of base plate 420, the standing waves are significantly removed by preventing the overlapping between the vibration of the rear sound generated from speaker 500 and the vibration of the reflected sound diffuse-reflected from base plate 420. Therefore, the elimination of the standing waves enables speaker assembly 400 to prevent the distortion of the audio sound, stabilize the input and output ratio of the audio sound, remove the howling phenomenon generated during using the telephone set, and to remove any other problems occurred in the audio sound.

As shown in FIGS. 8 through 10, speaker assembly 400 constructed according to the principles of the present invention adapted for use in wire or wireless terminals includes the grill having hole 450 discharging the audio sound, the hole 450 formed with a chamfer processed structure formed on an end of cone type hole 632, 636, 638 or with two half holes 621, 621 having the common base opening 623, for example, speaker 500 assembled into front plate 410 with a predetermined angle regardless of the shape of front plate 410 and providing the diffuse-reflection to the front and rear audio sound generated from speaker 500. Base plate 420 disposed behind speaker 500 includes either one of a inclined plane, a V shape structure, a circular structure, etc., and to diffuse-reflect the audio sound toward front and rear inner space 415, 425 within speaker assembly 400.

The masking effect is defined as follows. A small level signal disappears when a big level signal covering the small level signal exists. A particular sound is not audible when another sound is generated during generating the particular sound. That is, a phenomenon is called as a masking effect when we cannot hear a sound due to the existence of another sound. The sound is masked by the other sound. The articulation is defined as whether or not the audio sound is clearly transmitted. The howling is defined as follows. The output of the speaker vibrates air, and the vibration of the air changes the amplitude and the pressure of the audio sound and propagates in any direction. The audio sound reflects when meeting an obstacle. The reflected audio sound is feed back to a microphone, and the feedback signal is amplified and output from the speaker. In a specific frequency, the feedback signal of the audio sound is harmonized and continue to generate the very loud audio sound through the speaker.

Figure 12A:
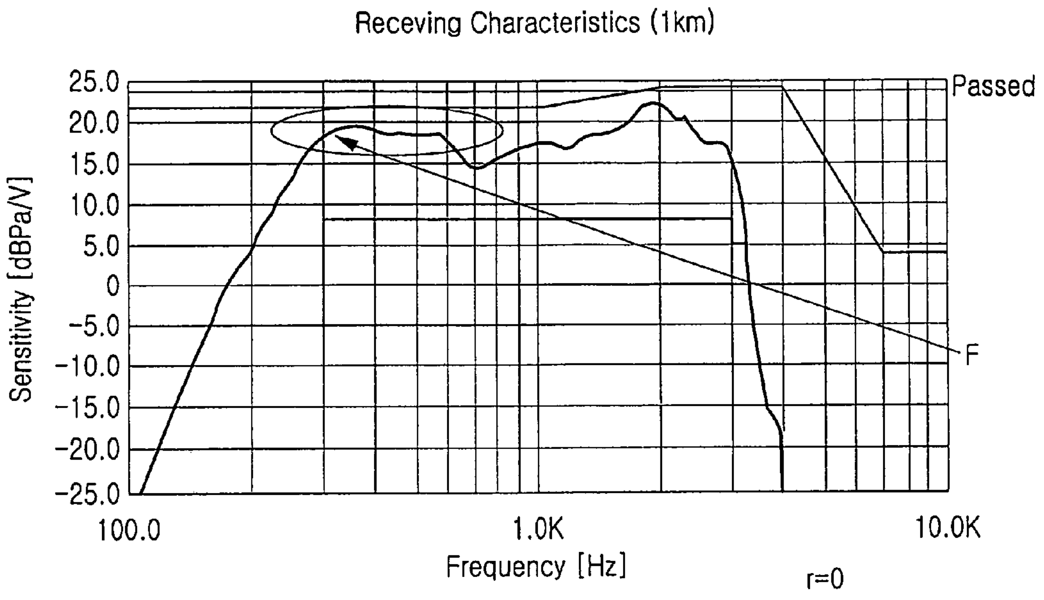
FIGS. 12A and 12B show a relationship between sensitivity and frequency in response to the shape of the curvature of a base plate facing the speaker in the speaker assembly.
Figure 12B:
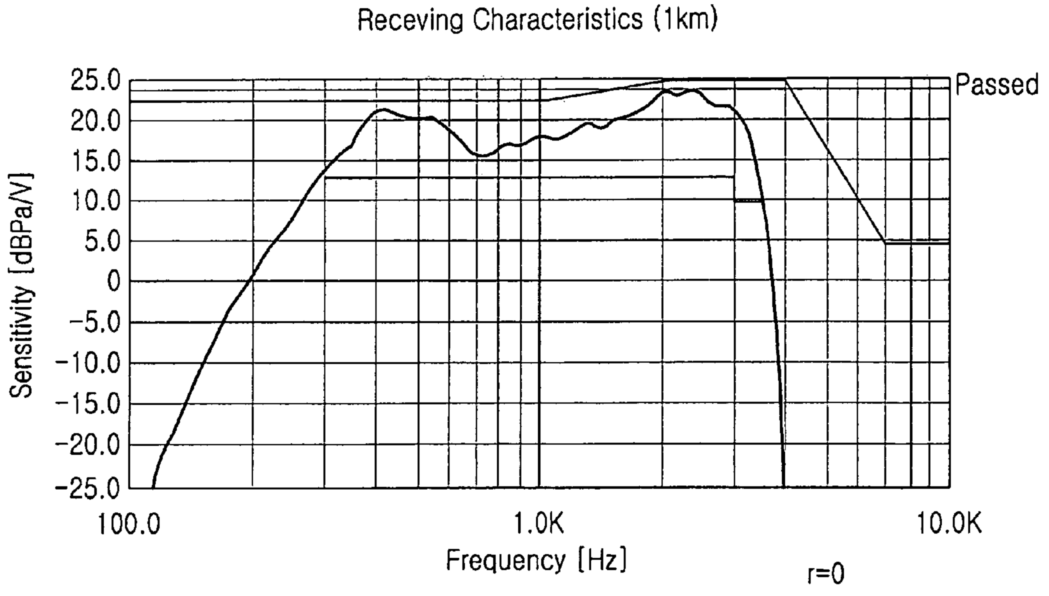

FIG. 12A shows frequency characteristics in the speaker assembly 400 having the cone type hole formed in the front plate 410 while FIG. 12B shows frequency characteristics in the speaker assembly having a cylindrical type hole formed on the front plate. Regarding the shape of the hole structure formed on the grill, the characteristics of the low frequency band indicated as F increase in amplitude in speaker assembly 400 having a hole having a hole with a large shaped opening area with a frustrum shaped hole as shown in FIG. 12A.

In a longitudinal hole having two half longitudinal holes formed along front plate 410 and having a 1.2 mm length, a common opening having an area being greater than 0.8 mm is formed on a common base portion of the two half longitudinal holes, a side parting shows the audio sound deteriorating due to the diffraction of the audio sound.

In a circular hole, a frustum shaped hole having a large opening area facing the speaker shows that the standing waves are prevented because of a large effective surface area of the hole. A reverse frustum shaped hole having a large opening area facing an outside of the housing shows that the characteristics of the low frequency audio sound are improved because of the principles of a megaphone. A circular hole with a half parting structure can be adapted.

Figure 13A:
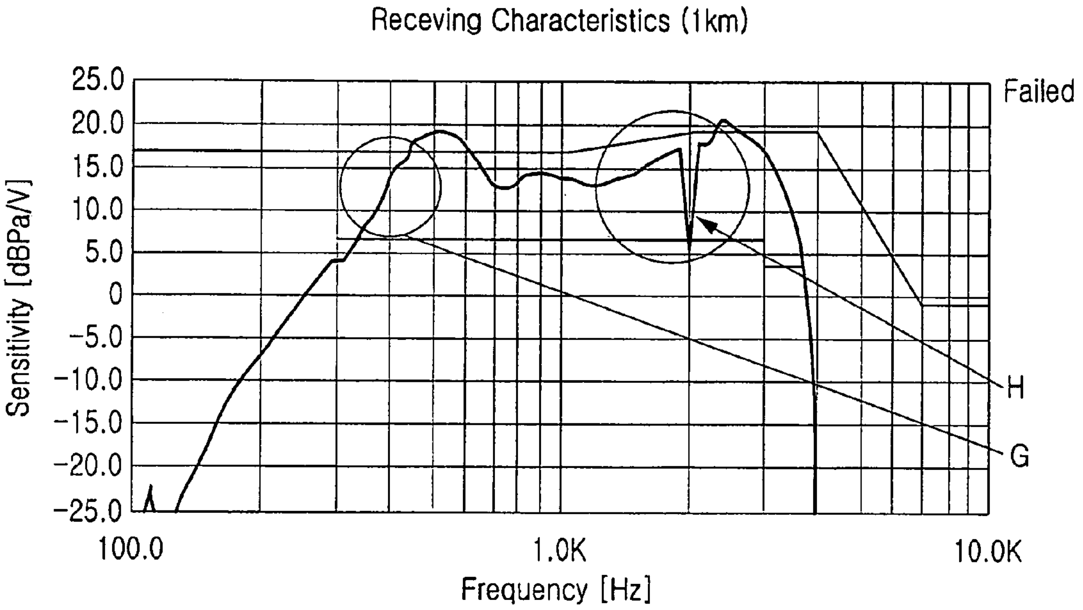
FIGS. 13A and 13B show a relationship between sensitivity and frequency in response to a distance between the rear side of a speaker and the base plate in a speaker assembly.
Figure 13B:
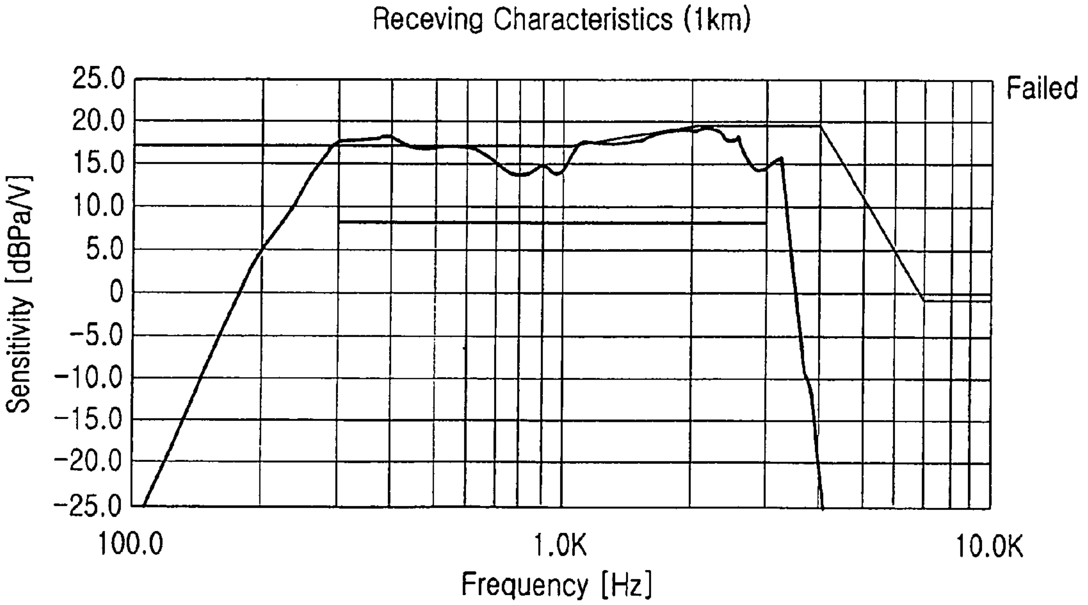

FIGS. 13A and 13B show frequency characteristics in speaker assembly 400 having base plate 420 spaced-apart from rear side 520 of speaker 500 by a distance of 5 mm and 11.7 mm, respectively. The characteristics of the low frequency band area indicated as G decrease, and the characteristics of a predetermined frequency band area indicated as H is distorted as shown in FIG. 13A. In case that the distance is shortened, the standing waves are generated, and the reflection of the audio sound pressure lowers the output of the speaker. Therefore, rear inner space 425 of speaker 500 should be provided, and the distance would be preferably at least 12.00 mm. The speaker generates sound equally in the back as well as toward the front. The sound in the back is called “harmonics.” It is helpful to disperse the reflecting sound of the harmonics without the harmonics returning to the speaker. If the distance is shorter than 12.00 mm, the output of the speaker does not come out properly due to the reflection of the pressure of sound.

Figure 14A:
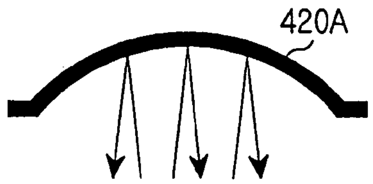
FIGS. 14A through 14E show various types of the base plates facing the rear side of the speaker in the speaker assembly.
Figure 14B:
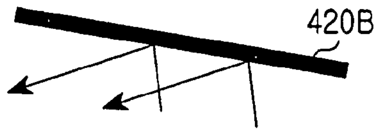
Figure 14C:
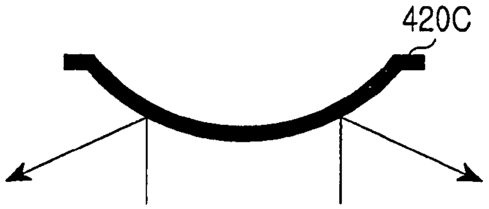
Figure 14D:
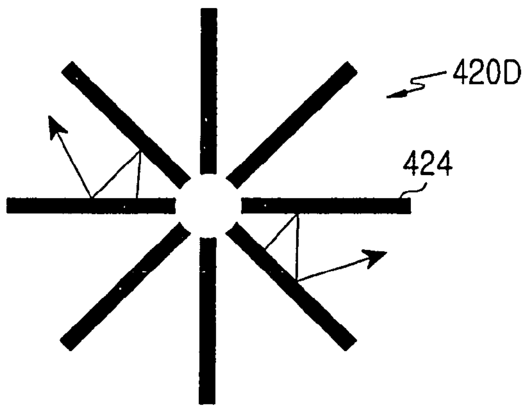
Figure 14E:
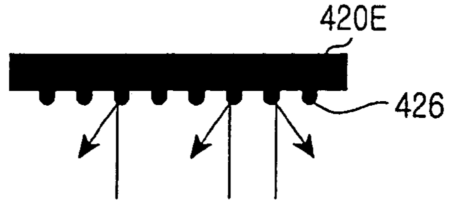

Various types of the base plate 420 are shown in FIGS. 14A through 14E such as the base plate 420 having a concave type 420A, base plate 420 having an inclined type structure 420B, a convex type structure 420C, a radial rib type structure 420D having radial rib 424, or an uneven structure 420E having projections 426. The frequency characteristics may be changed in response to the distance is changed from 11.7 mm to 5.0 mm between the speaker and the base plate. The structure of the base plate affects the frequency characteristics as the distance is shortened. The concave type 420A of FIG. 14A may generate standing waves, however an inclined 420B and a convex 420C may reduce standing waves. It is preferable that the inclined 420B or convex structure 420C of the base plate 420 is spaced-apart from the speaker as far as possible. A plurality of ribs 424 or projections 426 may be formed on the surface of the base plate 420 if the base plate is flat or parallel to the speaker. Therefore, the concave type 420A of FIG. 14A is not desirable because of the effects of the standing wave and the sound quality. On the other hand, the preferred shapes of the base plate 420 are inclined type structure 420B (FIG. 14B), radial rib type 420D (FIG. 14D), uneven structure 420E (FIG. 14E), and most preferably convex type 420C (FIG. 14C) because of the reduction of standing waves and increase of sound quality. The slope portions or the structure portions of the base plates 420B, 420C, 420D, and 420E can be larger than the external appearance of the desired speaker 500.

Figure 15A:
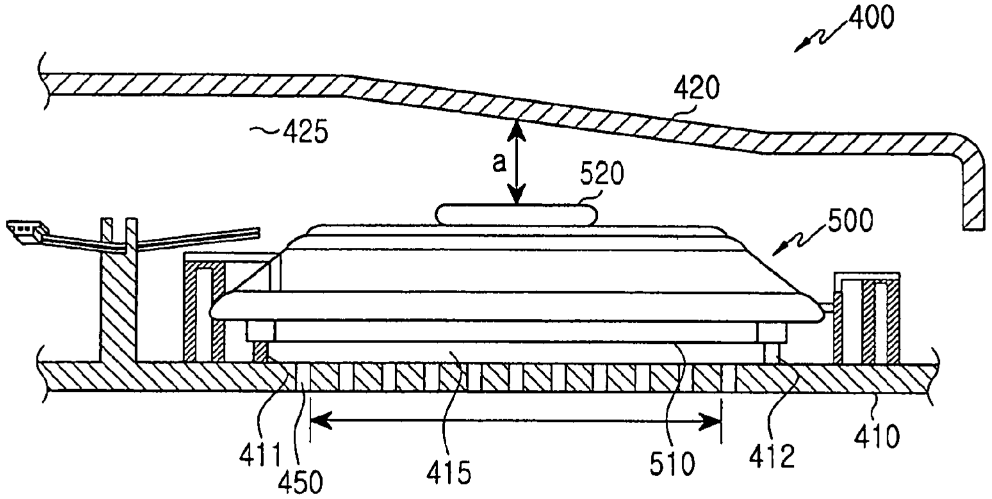
FIGS. 15A and 15B show another embodiment of the speaker assembly.
Figure 15B:
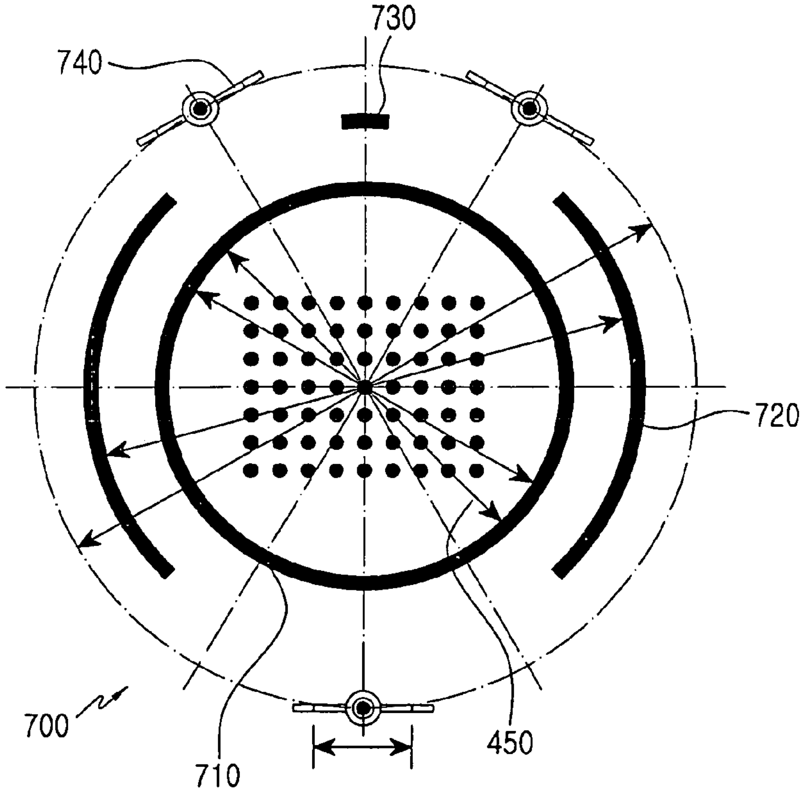

FIGS. 15A and 15B show another embodiment of speaker assembly 400 having both base plate 420 inclined with respect to rear side 520 of speaker 500 and front plate 410 having ribs and projections facing front side 510 of speaker 500. Speaker 500 is mounted on support 411, 412. Front side 520 of speaker 500 is parallel to front plate 520. Base plate 420 is inclined with respect to front plate 410 or rear side 520 of speaker 500 and is spaced-apart from rear side 520 of speaker 500 by a distance a varying along rear side 520 of speaker 500. An inner surface 700 of front plate 410 includes holes 450, a circular rib 710, arcuate ribs 720, 730, and guide ribs 730 formed on inner surface 700 and projected toward speaker 500. Holes 450 are formed inside circular rib 710. Ribs 710, 720, 730 are spaced-apart from each other in a radial direction.

As described above, the speaker assembly constructed according to the principles of the present invention includes the speaker mounted within a housing having a front plate and a base plate, the speaker being inclined with the front plate and the base plate. The base plate includes one of an inclined type structure, a convex type structure, a radial rib type structure having radial ribs, and an uneven structure having projections. The front plate includes holes having two half longitudinal holes formed on opposite sides of front plate and communicating with each other through a common opening formed between the two half longitudinal holes. The front plate also includes a cone type structure and a cylindrical type structure both formed on opposite sides of the front plate and communicating each other through a common base opening formed between the cone type structure and the cylindrical type structure. The cone type structure faces the speaker while the cylindrical type structure faces an outside of the front plate of the speaker assembly. The speaker assembly provides advantages in that standing waves are removed and that frequency characteristics of the speaker are improved.

While this invention has been particularly shown and described with reference to preferred embodiments thereof, it will be understood by those skilled in the art various changes in form and details maybe made therein without departing from the spirit and scope of the invention as defined by the appended claims.

What is claimed is:

1. A speaker assembly, comprising:

a housing including a front plate and a base plate coupled to and spaced-apart from said front plate; and a speaker disposed between said front plate and said base plate of said housing, said speaker including a front side facing only said front plate and being supported by said front plate, said front side of said speaker being inclined with respect to said front plate of said housing, said front plate including a plurality of holes accommodating an acoustic transmission from said speaker, wherein sound waves generated from said speaker are directly incident on said front plate.

2. The speaker assembly of claim 1, with said base plate being inclined with respect to said speaker, said front side of said speaker being mounted on said front plate, and said front plate being inclined with respect to said front side of said speaker and said base plate along an entire length of said speaker and said base plate.

3. The speaker assembly of claim 1, with said base plate including a flat surface including a plurality of projections raised toward said front plate and said speaker.

4. The speaker assembly of claim 1, with said front plate comprising a first support and a second support both projected from said front plate toward said front side of said speaker to support said speaker, said first and second supports having different heights.

5. The assembly of claim 4, with said front side of said speaker disposed on said first support and said second support to be inclined with respect to said front plate.

6. The assembly of claim 4, with said front side of said speaker disposed on said first support and said second support to be inclined with respect to said base plate.

7. The assembly of claim 1, with said speaker including a central axis passing through a center of said speaker, the central axis having a predetermined acute angle with a line perpendicular to said front plate of said housing.

8. The assembly of claim 1, with said front plate comprising an arcuate rib formed on an inner surface of said front plate.

9. The assembly of claim 1, with said front plate comprising a radial rib formed on an inner surface of said front plate.

10. The assembly of claim 1, with said front plate being perforated by a through hole, the through hole having a first hole and a second hole both formed on opposite sides of said front plate, the first and second holes including a common opening formed between the first and second holes.

11. The apparatus of claim 7, with the predetermined acute angle being approximately 2.6 degrees.

12. The apparatus of claim 1, with said front side of said speaker being coupled to said front plate of said housing in an inclined position with respect to said front plate, said base plate being solid and covering an entire back side of said speaker and said front plate covering an entire front side of said speaker, said front plate being perforated by the plurality of holes accommodating the acoustic transmission from said speaker.

13. The apparatus of claim 1, further comprising of a side wall connecting the front plate with the base plate to form a chamber in said housing, the acoustic transmission from said speaker being accommodated only from said front plate.

14. The apparatus of claim 1, with the front side of said speaker being connected only to said front plate of said housing.

15. A speaker assembly, comprising:

a housing including a front plate and a base plate coupled to and spaced-apart from said front plate; and a speaker disposed between said front plate and said base plate of said housing, said speaker including a front side facing said front plate, said front side of said speaker being inclined with respect to said front plate of said housing, said front plate accommodating an acoustic transmission from said speaker, with said front plate being perforated by a through hole, the through hole having a first hole and a second hole both formed on opposite sides of said front plate, the first and second holes including a common opening formed between the first and second holes, with said first hole including a cone structure defined by an outer circumferential surface of a frustum while the second hole is defined by an outer circumferential surface of a circular cylinder.

16. A speaker assembly, comprising:

a housing including a front plate and a base plate coupled to and spaced-apart from said front plate; and a speaker disposed between said front plate and said base plate of said housing, said speaker including a front side facing said front plate, said front side of said speaker being inclined with respect to said front plate of said housing, said front plate accommodating an acoustic transmission from said speaker, with said front plate being perforated by a through hole, the through hole having a first hole and a second hole both formed on opposite sides of said front plate, the first and second holes including a common opening formed between the first and second holes, with the first and second holes having a cone structure defined by an outer circumferential surface of a frustum, the first hole having a wider opening facing said speaker and the second hole having a wider opening towards an outside of said housing, respectively, the first and second holes including one side having a wider opening than the other side.

17. A speaker assembly, comprising:

a housing including a front plate with a plurality of holes and a base plate coupled to and spaced-apart from said front plate, said base plate including a structure selected from a group consisting of a convex plate raised toward said front plate, a cone type having a vertex facing said front plate, and a flat inclined type being inclined with respect to said front plate in the form of being raised toward said front plate; and a speaker disposed between said front plate and base plate, having a front side facing said front plate, having a rear side facing said base plate, with said front plate comprising a first support and a second support both projected from said front plate toward said front side of said speaker, said first and second supports being different from each other in height.

18. The assembly of claim 17, with said front side of said speaker disposed on said first support and said second support to be inclined with respect to said front plate.

19. The assembly of claim 17, with said front side of said speaker disposed on said first support and said second support to be inclined with respect to said base plate.

20. A speaker assembly, comprising:

a housing including a front plate and a base plate coupled to and spaced-apart from said front plate, said base plate being a solid base plate without holes, said base plate including a structure selected from a group consisting of a convex plate raised toward said front plate, a cone type having. a vertex facing said front plate, and a flat inclined type being inclined with respect to said front plate in the form of being raised toward said front plate; and a speaker disposed between said front plate and base plate, having a front side facing said front plate, having a rear side facing said base plate, with said front plate comprising any one of an arcuate rib and a radial rib each formed on an inner surface of said front plate.

21. A speaker assembly, comprising:

a housing including a front plate and a base plate coupled to and spaced-apart from said front plate, said base plate including a structure selected from a group consisting of a convex plate raised toward said front plate, a cone type having a vertex facing said front plate, a flat inclined type being inclined with respect to said front plate, and a flat type having a plurality ofprojections raised toward said front plate; and a speaker disposed between said front plate and base plate, having a front side facing said front plate, having a rear side facing said base plate, with said front plate being perforated by a through hole, the through hole including a first hole and a second hole both formed on opposite sides of said front plate, the first and second holes communicating with each other through a common opening formed between the first and second holes, with said first hole having a wall forming a frustum structure and said second hole being defined by an outer circumferential wall forming a reverse frustum structure.

22. A speaker assembly, comprising:

a housing including a front plate and a base plate coupled to and spaced-apart from said front plate, said base plate including a structure selected from a group consisting of a convex plate raised toward said front plate, a cone type having a vertex facing said front plate, a flat inclined type being inclined with respect to said front plate, and a flat type having a plurality ofprojections raised toward said front plate; and a speaker disposed between said front plate and base plate, having a front side facing said front plate, having a rear side facing said base plate, with said front plate being perforated by a through hole, the through hole including a first hole and a second hole both formed on opposite sides of said front plate, the first and second holes communicating with each other through a common opening formed between the first and second holes, with said first and second holes having a frustum shaped structure defined by an outer circumferential surface of the frustum, the first hole having a wider opening facing said speaker and second hole having a wider opening facing an outside of said housing.

23. A speaker assembly, comprising:

a housing including a front plate and a base plate coupled to and spaced-apart from said front plate, said front plate being perforated by a plurality of through holes of predetermined shapes; and a speaker disposed between said front plate and base plate, including a front side facing only said front plate, a rear side facing said base plate, said front side of said speaker being inclined with respect to said front plate, said front side of said speaker being supported by said front plate, wherein sound waves generated from said speaker are directly incident on said front plate.

24. The assembly of claim 23, each of the through hole including two half holes, a first half hole and a second half hole, formed on opposite sides of said front plate, the two half holes communicating with each other through a common opening formed between the two half holes.

25. The assembly of claim 23, with said base plate having a structure selected from a group consisting of a convex plate raised toward said front plate, a cone type having a vertex facing said front plate, and a flat type having a plurality of projections raised toward said front plate.

26. The assembly of claim 23, with said front plate comprising a first support and a second support both projected from said front plate toward said front side of said speaker, said first and second supports being different from each other in height.

27. The assembly of claim 26, with said front side of said speaker being disposed on said first support and said second support inclined with respect to said front plate.

28. The assembly of claim 26, with said front side of said speaker disposed on said first support and said second support inclined with respect to said base plate.

29. The assembly of claim 23, with said speaker including a central axis passing through a center of said speaker, the central axis having a predetermined acute angle with a line perpendicular to said front plate of said housing.

30. The assembly of claim 23, with said front plate comprising any one of an arcuate rib and a radial rib formed on an inner surface of said front plate.

31. A speaker assembly, comprising:

a housing including a front plate and a base plate coupled to and spaced-apart from said front plate, said front plate being perforated by a through hole of a predetermined shape; and a speaker disposed between said front plate and base plate, including a front side facing said front plate, a rear side facing said base plate, said front side of said speaker being inclined with respect to said front plate, the through hole including two half holes, a first half hole and a second half hole, formed on opposite sides of said front plate, the two half holes communicating with each other through a common opening formed between the two half holes, with said first half hole having a wall forming a frustum structure and said second half hole being defined by an outer circumferential wall forming a reverse frustum structure.

32. A speaker assembly, comprising:

a housing including a front plate and a base plate coupled to and spaced-apart from said front plate, said front plate being perforated by a through hole of a predetermined shape; and a speaker disposed between said front plate and base plate, including a front side facing said front plate, a rear side facing said base plate, said front side of said speaker being inclined with respect to said front plate, the through hole including two half holes, a first half hole and a second half hole, formed on opposite sides of said front plate, the two half holes communicating with each other through a common opening formed between the two half holes, with said first and second half holes including a frustum shaped structure defined by an outer circumferential surface of the frustum, the first half hole having a wider opening facing said speaker and second half hole having a wider opening facing an outside of said housing.

33. A method, comprising:

coupling a front plate with a base plate;

spacing-apart said base plate from said front plate;

perforating said front plate by a plurality of through holes of a predetermined shape;

disposing a speaker between said front plate and base plate of said housing, a front side facing said front plate, a rear side facing said base plate, supporting said speaker only through said front plate;

assembling said speaker into said front plate; and inclining a front side of said speaker with respect to said front plate.

34. The method of claim 33, each of the through holes comprising of forming two half holes on opposite sides of said front plate, the two half holes communicating with each other through a common opening formed between the two half holes.

35. The method of claim 33, with said base plate formed by a method selected from a group consisting of forming a convex plate raised toward said front plate, forming a cone type having a vertex facing said front plate, and forming a flat type having a plurality of projections raised toward said front plate.

36. The method of claim 33, with said front plate formed by the method comprising projecting a first support and a second support from said front plate toward said front side of said speaker, said first and second supports being different from each other in height, said front side of said speaker being disposed on said first support and said second support inclined with respect to said front plate and said base plate.

37. The method of claim 33, with said speaker inclined at a predetermined acute angle with respect to said front plate and said front plate including an integrally formed rib.

38. The method of claim 37, with said predetermined acute angle with respect to said front plate being an acute angle of approximately 2.6 degrees.

39. An apparatus, comprising:

a housing including a front plate and a base plate coupled to and spaced-apart from said front plate; and a transducer disposed between said front plate and base plate of said housing, said transducer including a front side facing said front plate, said front side of said transducer being inclined with respect to said front plate of said housing, said front side of said transducer being connected to said front plate, with said base plate being selected from a group consisting of a convex plate raised toward said front plate, and a cone type having a vertex facing said front plate, with said front plate comprising a first support and a second support both projected from said front plate toward said front side of said transducer to support said transducer, said first and second supports having different heights.

40. The apparatus of claim 39, with said front side of said transducer disposed on said first support and said second support to be inclined with respect to said front plate.

41. The apparatus of claim 39, with said front side of said transducer disposed on said first support and said second support to be inclined with respect to said base plate.

42. An apparatus, comprising:

a housing including a front plate and a base plate coupled to and spaced-apart from said front plate; and a transducer disposed between said front plate and base plate of said housing, said transducer including a front side facing said front plate, said front side of said transducer being inclined with respect to said front plate of said housing, said front side of said transducer being connected to said front plate, with said base plate being selected from a group consisting of a convex plate raised toward said front plate, and a cone type having a vertex facing said front plate, with said front plate comprising an arcuate rib formed on an inner surface of said front plate.

43. An apparatus, comprising:

a housing including a front plate and a base plate coupled to and spaced-apart from said front plate; and a transducer disposed between said front plate and base plate of said housing, said transducer including a front side facing said front plate, said front side of said transducer being inclined with respect to said front plate of said housing and being mounted on and supported by said front plate, with said front plate comprising a radial rib formed on an inner surface of said front plate.

44. A speaker assembly, comprising:

a housing including a front plate and a base plate coupled to and spaced-apart from said front plate; and a speaker disposed between said front plate and said base plate of said housing, said speaker including a front side facing said front plate, said front side of said speaker being inclined with respect to said front plate of said housing, said front plate accommodating an acoustic transmission from said speaker, with said front plate being perforated by a through hole, the through hole having a first hole and a second hole both formed on opposite sides of said front plate, the first and second holes including a common opening formed between the first and second holes, with the walls of the through hole forming a shape distinct from the shape formed by the walls of the first hole and the shape formed by the walls of the second hole individually, with one of said first and second holes including a cone shape.

45. The apparatus of claim 44, with the through hole including the first and second holes being formed in front of the front side of said speaker accommodating the acoustic transmission from said speaker.

46. A speaker assembly, comprising:

a housing including a front plate and a base plate coupled to and spaced-apart from said front plate; and a speaker disposed between said front plate and said base plate of said housing, said speaker including a front side facing said front plate, said front side of said speaker being inclined with respect to said front plate of said housing, said front plate accommodating an acoustic transmission from said speaker, with said front plate being perforated by a through hole, the through hole having a first hole and a second hole both formed on opposite sides of said front plate, the first and second holes including a common opening formed between the first and second holes, with the shape formed by the walls of the first hole being distinct from the shape formed by the walls of the second hole, with at least one of said first and second holes including a conic section.

* * * * *